(12) United States Patent
Fritzsche et al.

(10) Patent No.: US 10,345,547 B2
(45) Date of Patent: Jul. 9, 2019

(54) METHOD FOR PRODUCING A LENS FOR A LITHOGRAPHY APPARATUS, AND MEASUREMENT SYSTEM

(71) Applicant: Carl Zeiss SMT GmbH, Oberkochen (DE)

(72) Inventors: Steffen Fritzsche, Aalen (DE); Juergen Baier, Oberkochen (DE); Rolf Freimann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/813,660

(22) Filed: Nov. 15, 2017

(65) Prior Publication Data

US 2018/0074278 A1    Mar. 15, 2018

Related U.S. Application Data

(63) Continuation of application No. PCT/EP2016/057078, filed on Mar. 31, 2016.

(30) Foreign Application Priority Data

May 20, 2015  (DE) .................. 10 2015 209 173

(51) Int. Cl.
  *G02B 7/00* (2006.01)
  *G01M 11/02* (2006.01)
  *G03F 7/20* (2006.01)
  *G02B 7/02* (2006.01)

(52) U.S. Cl.
  CPC ......... *G02B 7/003* (2013.01); *G01M 11/0221* (2013.01); *G01M 11/0292* (2013.01); *G02B 7/023* (2013.01); *G03F 7/7015* (2013.01); *G03F 7/7085* (2013.01); *G03F 7/70258* (2013.01)

(58) Field of Classification Search
  CPC ......... G01M 11/0221; G01M 11/0292; G01M 11/0257; G01M 11/0264; G02B 7/003; G02B 7/023; G03F 7/7015; G03F 7/70258; G03F 7/7085; G03F 7/70591
  USPC .................................................. 356/123–137
  See application file for complete search history.

(56) References Cited

U.S. PATENT DOCUMENTS

2009/0147228 A1   6/2009  Ono et al.
2011/0001945 A1   1/2011  Shiraishi

FOREIGN PATENT DOCUMENTS

DE    101 13 017 A1   9/2002
EP    1 220 037 A2    7/2002
JP    2004-128307     4/2004
WO    WO 2006/125609 A1  11/2006

OTHER PUBLICATIONS

Translation of International Search Report for corresponding Appl No. PCT/EP2016/057078, dated Aug. 29, 2016.

*Primary Examiner* — Tri T Ton
(74) *Attorney, Agent, or Firm* — Fish & Richardson P.C.

(57) ABSTRACT

A method for producing a lens for a lithography apparatus is disclosed. A measurement system for ascertaining an optical characteristic of a partial lens for a lithography apparatus is also disclosed.

28 Claims, 9 Drawing Sheets

METHOD FOR PRODUCING A LENS FOR A LITHOGRAPHY APPARATUS, AND MEASUREMENT SYSTEM

CROSS-REFERENCE TO RELATED APPLICATIONS

The present application is a continuation of, and claims benefit under 35 USC 120 to, international application PCT/EP2016/057078, filed Mar. 31, 2016, which claims benefit under 35 USC 119 of German Application No. 10 2015 209 173.2, filed May 20, 2015. The entire disclosure of these applications are incorporated by reference herein.

FIELD

The disclosure relates to a method for producing a lens for a lithography apparatus. Moreover, the disclosure relates to a measurement system for ascertaining an optical characteristic of a partial lens for a lithography apparatus.

BACKGROUND

Microlithography is used for producing microstructured components, for example integrated circuits. The microlithographic process is carried out with a lithography apparatus, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, have to be used instead of—as previously—refractive optical units, that is to say lens elements.

The mirrors may for example be fastened to a supporting frame (force frame) and be designed as at least partially manipulable, in order to allow a movement of a respective mirror in up to six degrees of freedom, and consequently a highly accurate positioning of the mirrors in relation to one another, in particular in the pm range. This allows changes in the optical properties that occur for instance during the operation of the lithography apparatus, for example as a result of thermal influences, to be compensated for.

Usually, lithography apparatuses are set up at the producer. In particular, this includes positioning and aligning the mirrors with respect to one another. "Positioning" means a movement of a corresponding mirror in up to three translational degrees of freedom. "Aligning" means a movement of a corresponding mirror in up to three rotational degrees of freedom. Positioning and aligning the mirrors is repeated until an image that is produced at the entry side of the projection lens of the lithography apparatus is imaged correctly at the exit side of the lens. Subsequently, the mirrors are fixed in their respective spatial orientation. Qualification of the lithography apparatus is completed herewith.

In order now to bring such a lithography apparatus to the customer, the latter—already on account of its large dimensions—are typically dismantled into its individual parts. Then, the process described above of positioning and aligning the mirrors has to be repeated at the customer. This process can be very complicated—not only because of the multiplicity of individual positioning and alignment steps, but also because of the increasing size of the individual mirrors (partly with diameters greater than 2 m) and a correspondingly large weight of the mirrors.

Therefore, the prior art has disclosed approaches for simplifying the process described above.

By way of example, JP 2004-128307 A thus describes a projection lens which includes two partial lenses. The partial lenses each contain three mirrors. An intermediate image plane is formed between the two partial lenses. Consequently, the mirrors within each partial lens can be positioned and aligned with respect to one another. The correct position and alignment of the mirrors is checked on the basis of the intermediate image plane. After qualification of a respective partial lens, the partial lenses are assembled to form the lens.

US 2011/0001945 A1 describes an approach in which a projection lens likewise is subdivided into a plurality of partial lenses. The partial lenses are positioned and aligned with respect to one another at the producer. The position and alignment is checked and stored via appropriate sensors. For the purposes of transportation to the customer, the lens is dismantled, once again, into its partial lenses. At the customer, the lens can easily be assembled again from the partial lenses with the aid of the sensors and stored data, with the original positioning and alignment of the partial lenses with respect to one another being reproduced.

SUMMARY

The disclosure seeks to provide an improved method for producing a lens for a lithography apparatus. Furthermore, the disclosure seeks to provide an improved measurement system for ascertaining an optical characteristic of a partial lens for a lithography apparatus.

Accordingly, a method for producing a lens for a lithography apparatus is provided, the method having the following steps: a) providing at least one first and one second partial lens, wherein the at least one first partial lens includes a plurality of optical elements and the at least one second partial lens includes at least one optical element, wherein the at least one first and second partial lens each have a beam path which has a non-homocentric embodiment on the entry side and/or exit side of a respective partial lens, b) transmitting at least one first light beam along a respective beam path of the at least one first and second partial lens and capturing the at least one first light beam downstream of a respective partial lens, c) ascertaining at least one optical characteristic of a respective partial lens on the basis of the captured, at least one first light beam, d) adjusting the plurality of optical elements of a respective partial lens depending on the ascertained optical characteristic, and e) joining the at least one first partial lens and the at least one second partial lens to produce the lens.

The disclosure recognizes that it is not always possible to subdivide a lens into partial lenses in such a way that intermediate image planes are situated between the partial lenses. Instead it may be advantageous, for reasons of creating partial lenses with an advantageous geometry or advantageous packaging dimensions, for example, to subdivide a corresponding lens into partial lenses, with precisely no intermediate image plane being situated at the interfaces between two lenses in each case. As a rule, the beam path between two corresponding partial lenses is not homocentric in such cases. This means that the light beams cannot be traced back to a single point and are not parallel either.

Optical qualification of a respective partial lens in the case of such a non-homocentric beam path has been a problem, i.e., in particular, undertaking the positioning and alignment of the respective mirrors in such a way that a correct image is produced via the lens after joining the partial lenses to form the lens.

The disclosure facilitates precisely such a qualification of a partial lens with a non-homocentric beam path. To this end, a first light beam is sent through each of the first and second partial lenses and captured after a respective partial lens. An optical characteristic of a respective partial lens is ascertained from the captured first light beam. The optical elements of the first and second partial lenses are adjusted depending on the ascertained optical characteristic. By way of example, the optical characteristic of the at least one first light beam can relate to a position, an angle and/or a wavelength of the same at the exit side of the corresponding partial lens. Further, the optical characteristic can contain comparing the position, the angle and/or the wavelength with a corresponding reference value.

Dividing the lens into plurality of partial lenses advantageously leads to a reduction in the complexity of the adjustment process, as explained in more detail below. Here, "adjusting" includes positioning and/or aligning of the corresponding optical element. "Positioning" means a movement of the corresponding optical element in up to three translational degrees of freedom. "Aligning" means a movement of the corresponding optical element in up to three rotational degrees of freedom.

By way of example, the number of possible original states is understood to be a measure for the complexity. The reduction of possible original states is calculated below using the example of the decomposition of an eight-component lens into three partial lenses:

Let $N_1, N_2, N_3, \ldots, N_k$ be the number of possible positioning and alignment states of the optical elements 1, 2, 3, ..., k, where k=8 applies here. Let $M_{1\,2}$ and $M_{2\,3}$ be the number of possible original states when adjusting the partial lenses with respect to one another, i.e. partial lens 1 to partial lens 2 and partial lens 2 to partial lens 3. In the case of an overall lens adjustment, $N_1 \cdot N_2 \cdot N_3 \cdot \ldots \cdot N_8$ original states are possible. In the case of the modularized adjustment, the number of possible original states is: $N_1 \cdot N_2 \cdot N_3 + N_4 \cdot N_5 \cdot N_6 + N_7 \cdot N_8 + M_{1\,2} \cdot M_{2\,3}$. If, for reasons of simplicity, the assumption is made that the number of possible original states is the same in all optical elements and partial lenses, this number being referred to here as N, then there is a reduction in the original state number from $N^8$ to only still $2 \cdot N^3 + 2 \cdot N^2$.

In principle, the first partial lens can contain two or more optical elements. The second partial lens can contain one or more optical elements. Typically, a lens contains six, seven, eight or nine mirrors. Advantageously, these can be subdivided into e.g. three partial lenses. As a result, the corresponding simplification of the assembly emerges, as explained above in an exemplary manner.

According to an embodiment, the at least one first light beam is captured by a capturing device, on which the light beam produces a light spot, wherein ascertaining the at least one optical characteristic includes comparing the light spot to a reference light spot. The comparison step can be effectuated automatically, for example, via a suitable computer device.

According to a further embodiment, a position of the light spot is compared to the position of the reference light spot. As a result, a simple method emerges.

According to a further embodiment, at least one first and one spaced apart second light beam are transmitted along the respective beam path of the at least one first and second partial lens and captured downstream of the respective partial lens, wherein the at least one optical characteristic is ascertained on the basis of the captured, first and second light beams. As a result of use being made of two spaced apart light beams, these take a different course along the beam path along a respective partial lens in each case, and so more information can be obtained about a respective partial lens.

According to a further embodiment, the at least one first and second light beam are captured by a capturing device, on which the at least one first and second light beam produce a light spot pattern, wherein ascertaining the at least one optical characteristic includes comparing the light spot pattern to a reference light spot pattern. This step of comparing the light spot pattern to a reference light spot pattern can also be effectuated automatically. By way of example, an adjustment of the optical elements of the corresponding partial lens can be repeated until a mean distance of the light spot of the light spot pattern from reference light spots of the reference light spot pattern is minimal.

According to a further embodiment, the at least one first and the spaced apart second light beam are produced by virtue of a light source being moved between two positions. The movement of the light source between the two positions can be effectuated automatically.

According to an embodiment, the light source is moved between the two positions via a robot. As a result, a simple, repeatable method emerges.

According to a further embodiment, the at least one first and the spaced apart second light beam are produced by virtue of two spaced apart light sources being provided. By way of example, the two spaced apart light sources can be produced by virtue of a mask having at least two light passages being irradiated by a light source.

According to a further embodiment, the at least one optical characteristic of at least one partial lens is ascertained using a deflectometric measuring method. Here, deflectometry denotes the contactless capture or measurement of mirroring surfaces. Here, use is made of techniques from photometry, radiometry, photogrammetry, laser scanning or laser range finding.

According to a further embodiment, for the deflectometric measuring method, at least one light source for producing the at least one first light beam and a mask illuminated thereby are arranged upstream of at least one partial lens and a capturing device for capturing the at least one first light beam is arranged downstream of the corresponding partial lens. As a result, a simpler measurement construction emerges.

According to a further embodiment, the at least one optical characteristic of at least one partial lens is ascertained using a method for a wavefront measurement. Here, a "wavefront measurement" means, in particular, a capture of the local inclination of the wavefront in relation to a reference. The inclination or a corresponding displacement of light spots can be measured using spatially sensitive detectors which are contained in, for example, the capturing device. In particular, a Shack-Hartmann sensor can be used for the wavefront measurement.

According to a further embodiment, the method for a wavefront measurement, at least one light source for producing the at least one first light beam and a mask illuminated thereby are arranged upstream of the at least one partial lens. Provision is further made of a correcting optical unit for correcting the at least one first light beam. Moreover, a capturing device for capturing the at least one first, corrected light beam is arranged downstream of the corresponding partial lens. The correcting optical unit can be arranged up-stream of or downstream of the partial lens and it is configured to filter information that is suitable for the capturing device from the at least one first light beam.

According to a further embodiment, the correcting optical unit includes a microlens array or a pinhole aperture grid. It is possible to produce a characteristic light spot pattern from the incident wavefront via the microlens array or the pinhole aperture grid, it being possible, in turn, to compare the light spot pattern to a corresponding reference light spot pattern in a simple manner.

According to a further embodiment, the correcting optical unit has a computer-generated hologram. "Computer-generated hologram" means that a corresponding holographic interference pattern is produced digitally. By way of example, this production may include the holographic interference pattern being calculated digitally and subsequently being printed onto a mask or a film. The mask or the film is illuminated by the at least one first and/or a second light beam. Alternatively, the computer-generated hologram can also be produced under partial or full use of a holographic 3D screen. The at least one first and/or second light beam can be modified via the computer-generated hologram in such a way that advantageous information for the capturing device is generated. By way of example, the modification can be such that an intermediate image plane is produced "artificially" at the exit side of the corresponding partial lens. A comparison of the entry-side picture with its corresponding image in the intermediate image plane then allows a simple adjustment of the optical elements of the corresponding partial lens until the picture and image correspond.

According to a further embodiment, the correcting optical unit has respectively one computer-generated hologram for each light beam. When use is made of a correcting optical unit having a computer-generated hologram, a dedicated computer-generated hologram can be used for each utilized field point. As a result, the amount of information available for the readjustment can be significantly increased. Here, the computer-generated holograms can be arranged downstream of the field points.

According to a further embodiment, the computer-generated hologram is arranged upstream of the microlens array or the pinhole aperture grid. That is to say, the at least one first and/or second light beam initially passes through the computer-generated hologram and subsequently reaches the capturing unit through the microlens array or the pinhole aperture grid.

According to a further embodiment, the computer-generated hologram is configured to parallelize the at least one first and second light beam. Capturing and evaluating parallel light or ascertaining a corresponding optical characteristic is simple. In particular, this provides the option of providing an intermediate image plane on the exit side at a corresponding partial lens.

According to a further embodiment, the at least one optical characteristic of at least one partial lens is ascertained using the wavefront measuring method without a computer-generated hologram in a first step and with a computer-generated hologram in the second step. There preferably is an adjustment of the optical elements of the corresponding partial lens after both the first step and the second step. As a consequence, there can be an approximate adjustment (without a computer-generated hologram) and subsequently a fine adjustment (with a computer-generated hologram).

According to a further embodiment, the capturing device is a ground glass screen and/or an electronic chip. By way of example, a CMOS or a CCD chip can be used as an electronic chip.

According to a further embodiment, the plurality of optical elements of the first partial lens and the at least one optical element of the second partial lens are fixed after step d). Fixing ensures that there cannot be a change in the position and/or alignment of the optical elements, even in the case of a transportation of the individual partial lenses, in particular on the way to the customer.

According to a further embodiment, each of the plurality of optical elements of the first partial lens and/or the at least one optical element of the second partial lens are actuatable between a first and a second position and/or alignment during the operation of the lithography apparatus, wherein step c) is carried out in the first and second positions and/or alignments. Consequently, it is also possible to carry out a dynamic qualification of a respective partial lens. Accordingly, corrections and repairs in respect of the corresponding actuators or travels of the actuatable optical elements already can be carried out during the qualification of a respective partial lens. This results in a further reduction in the assembly outlay.

According to a further embodiment, an imaging optical characteristic of the produced lens is ascertained after step e) at the operating wavelength. In principle, the at least one first and/or second light beam can have the operating wavelength or else other wavelengths. The operating wavelength depends on the type of the lithography apparatus. Preferably, the lithography apparatus can be an EUV or DUV lithography apparatus. EUV stands for "extreme ultraviolet" and refers to a wavelength of the working light or an operating wavelength of between 0.1 and 30 nm. DUV stands for "deep ultraviolet" and refers to a wavelength of the working light of between 30 and 250 nm. It is possible to ensure the correct functionality of the lens overall by comparing an exit side image to an entry side picture in a step after joining the partial lenses to form the lens. Preferably, the lens is a projection lens of a lithography apparatus.

According to a further embodiment, post-processing of surfaces or an actuation of one or more of the optical elements of the at least one first or second partial lens is effectuated depending on the ascertained imaging optical characteristic. As a consequence, a further correction of the beam path can be undertaken even after the production of the lens.

According to a further embodiment, an interface in the beam path between the at least one first and second partial lens subdivides a distance between an optical element of the first partial lens and an optical element of the second partial lens, the distance being longer than the longest distance between every two adjacent optical elements of the at least one first and second partial lens. "Interface" refers to the region in which the at least first and second partial lens are joined to form the lens. An interface chosen in this way may be advantageous for structural reasons or reasons of space.

According to a further embodiment, at least three partial lenses are provided. The third partial lens can have at least one or more optical elements. What was explained above in respect of the first and second partial lens applies accordingly to the third partial lens. Naturally, provision could also be made of more than three partial lenses, for example five partial lenses.

According to a further embodiment, the plurality of optical elements of the first partial lens and/or the at least one optical element of the second partial lens are mirrors and/or lens elements. The lens elements are preferably arranged for single passage, i.e. the light passes therethrough in one direction only.

According to a further embodiment, two or more partial lenses are combined to form a partial lens. As a result of this, new partial lenses are constructed, it being possible to measure the new partial lenses, in turn, using the methods described above. Here, the combination to new partial lenses may mean that the individual partial lenses are arranged and fixed with respect to one another.

According to a further embodiment, steps a) to e) are repeated with the combined partial lens. Advantageously, a combined partial lens can also be measured using the methods described above.

Furthermore, a measurement system for ascertaining an optical characteristic of a partial lens for a lithography apparatus is provided. The measuring system includes the following: a transmission apparatus for transmitting at least one first light beam along a beam path of the partial lens, a correcting optical unit which has a computer-generated hologram, a capturing device for capturing the at least one first light beam, and an ascertaining device for ascertaining at least one optical characteristic of the partial lens on the basis of the captured, at least one first light beam. As described above, the use of a computer-generated hologram allows advantageous information to be generated for the capturing device.

The features, embodiments and advantages described in relation to the method apply accordingly to the measurement system.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

BRIEF DESCRIPTION OF THE DRAWINGS

Further advantageous configurations and aspects of the disclosure are the subject of the dependent claims and also of the exemplary embodiments of the disclosure described below. In the text that follows, the disclosure is explained in more detail on the basis of preferred embodiments with reference to the accompanying figures, in which:

DETAILED DESCRIPTION

Unless otherwise indicated, the same reference signs in the figures denote elements that are the same or functionally the same. It should also be noted that the illustrations in the figures are not necessarily to scale.

Figure 1A:
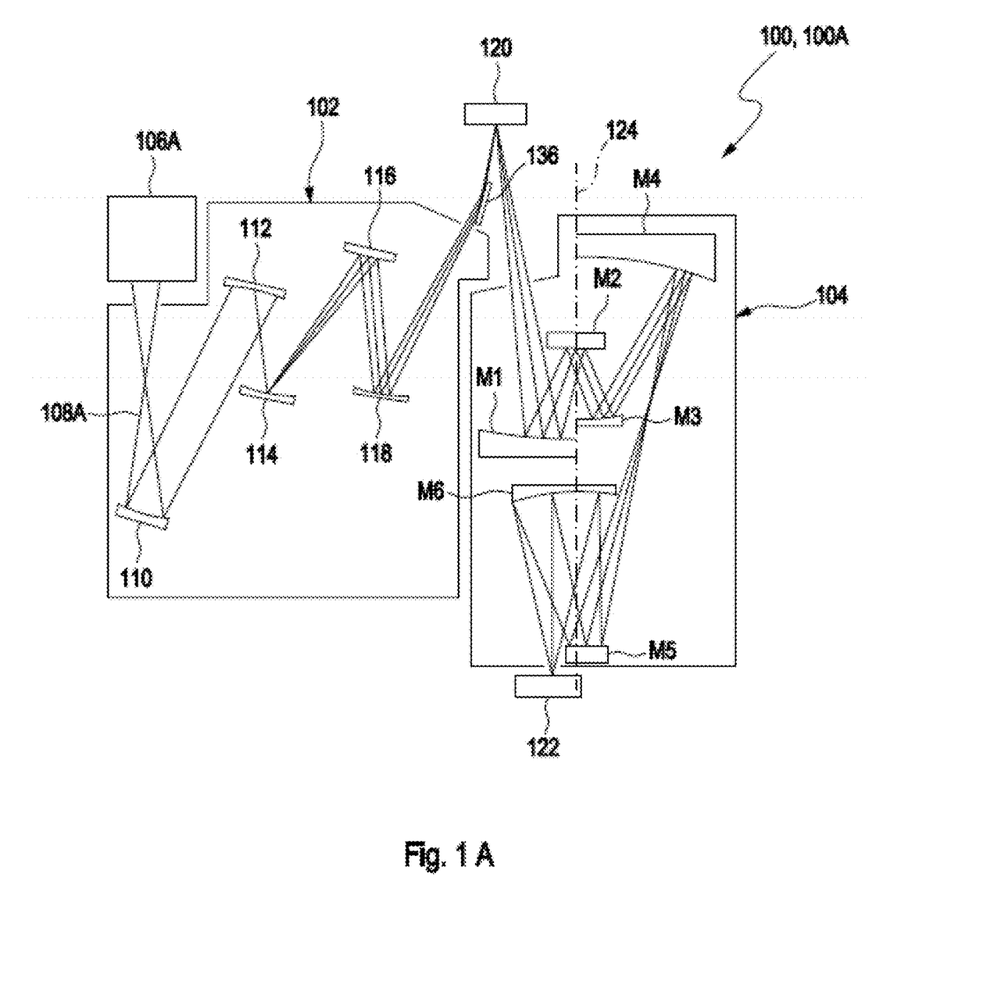
FIG. 1A shows a schematic view of an EUV lithography apparatus.

FIG. 1A shows a schematic view of an EUV lithography apparatus 100A, which includes a beam-shaping and illumination system 102 and a projection system 104. EUV stands for "extreme ultraviolet" and refers to a wavelength of the operating light of between 0.1 and 30 nm. The beam-shaping and illumination system 102 and the projection system 104 are respectively provided in a vacuum housing, each vacuum housing being evacuated with the aid of an evacuation device that is not represented any more specifically. The vacuum housings are surrounded by a machine room (not depicted in any more detail), in which the drive apparatuses for mechanically moving or adjusting the optical elements are provided. Moreover, electrical controllers and the like can also be provided in this machine room.

The EUV lithography apparatus 100A includes an EUV light source 106A. A plasma source or a synchrotron, which emit radiation 108A in the EUV range (extreme ultraviolet range), i.e., for example, in the wavelength range of 0.1 nm to 30 nm, may be provided, for example, as the EUV light source 106A. In the beam-shaping and illumination system 102, the EUV radiation 108A is focused and the desired operating wavelength is filtered out from the EUV radiation 108A. The EUV radiation 108A produced by the EUV light source 106A has a relatively low transmissivity through air, for which reason the beam guiding spaces in the beam shaping and illumination system 102 and in the projection system 104 are evacuated.

The beam-shaping and illumination system 102 illustrated in FIG. 1A has five mirrors 110, 112, 114, 116, 118. After passing through the beam shaping and illumination system 102, the EUV radiation 108A is directed onto the reticle 120. The reticle 120 is likewise formed as a reflective optical element and can be arranged outside the systems 102, 104. Furthermore, the EUV radiation 108A may be directed onto the reticle via a mirror 136. The reticle 120 has a structure which is imaged onto a wafer 122 or the like in a reduced fashion via the projection system 104.

The projection system 104 has six mirrors M1-M6 for imaging the reticle 120 onto the wafer 122. In this case, individual mirrors M1-M6 of the projection system 104 may be arranged symmetrically in relation to the optical axis 124 of the projection system 104. It should be noted that the number of mirrors of the EUV lithography apparatus 100A is not restricted to the number represented. A greater or lesser number of mirrors can also be provided. Furthermore, the mirrors, as a rule, are curved on their front side for beam shaping.

Figure 1B:
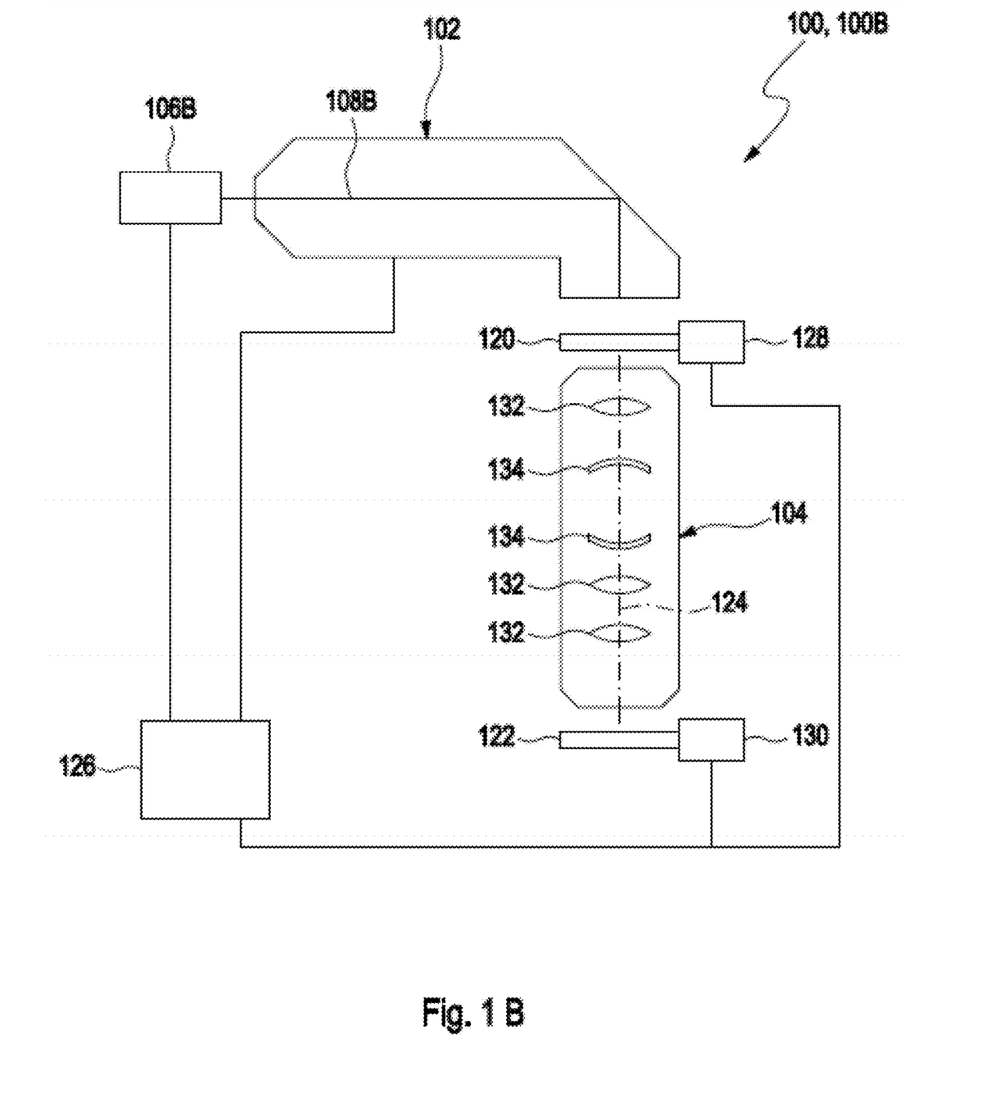
FIG. 1B shows a schematic view of a DUV lithography apparatus.

FIG. 1B shows a schematic view of a DUV lithography apparatus 100B, which includes a beam-shaping and illumination system 102 and a projection system 104. DUV stands for "deep ultraviolet" and refers to a wavelength of the working light of between 30 and 250 nm. The beam shaping and illumination system 102 and the projection system 104 are surrounded by a machine room (not depicted in any more detail), in which the drive apparatuses for mechanically moving or adjusting the optical elements are provided. The DUV lithography apparatus 100B furthermore includes a control device 126 for controlling various components of the DUV lithography apparatus 100B. In this case, the control device 126 is connected to the beam shaping and illumination system 102, a DUV light source 106B, a stage 128 of the reticle 120 (reticle stage) and a stage 130 of the wafer 122 (wafer stage).

The DUV lithography apparatus 100B has a DUV light source 106B. By way of example, an ArF excimer laser that emits radiation 108B in the DUV range at 193 nm can be provided as the DUV light source 106B.

The beam-shaping and illumination system 102 illustrated in FIG. 1B guides the DUV radiation 108B onto a reticle 120. The reticle 120 is embodied as a transmissive optical element and can be arranged outside the systems 102, 104. The reticle 120 has a structure which is imaged onto a wafer 122 or the like in a reduced fashion via the projection system 104.

The projection system 104 has a plurality of lenses 132 and/or mirrors 134 for imaging the reticle 120 onto the wafer 122. In this case, individual lens elements 132 and/or mirrors 134 of the projection system 104 can be arranged symmetrically in relation to the optical axis 124 of the projection system 104. It should be noted that the number of lenses and mirrors of the DUV lithography apparatus 100B is not restricted to the number represented. A greater or lesser number of lens elements and/or mirrors can also be provided. In particular, the beam shaping and illumination system 102 of the DUV lithography apparatus 100B includes a plurality of lens elements and/or mirrors. Furthermore, the mirrors, as a rule, are curved on their front side for beam shaping.

Figure 2:
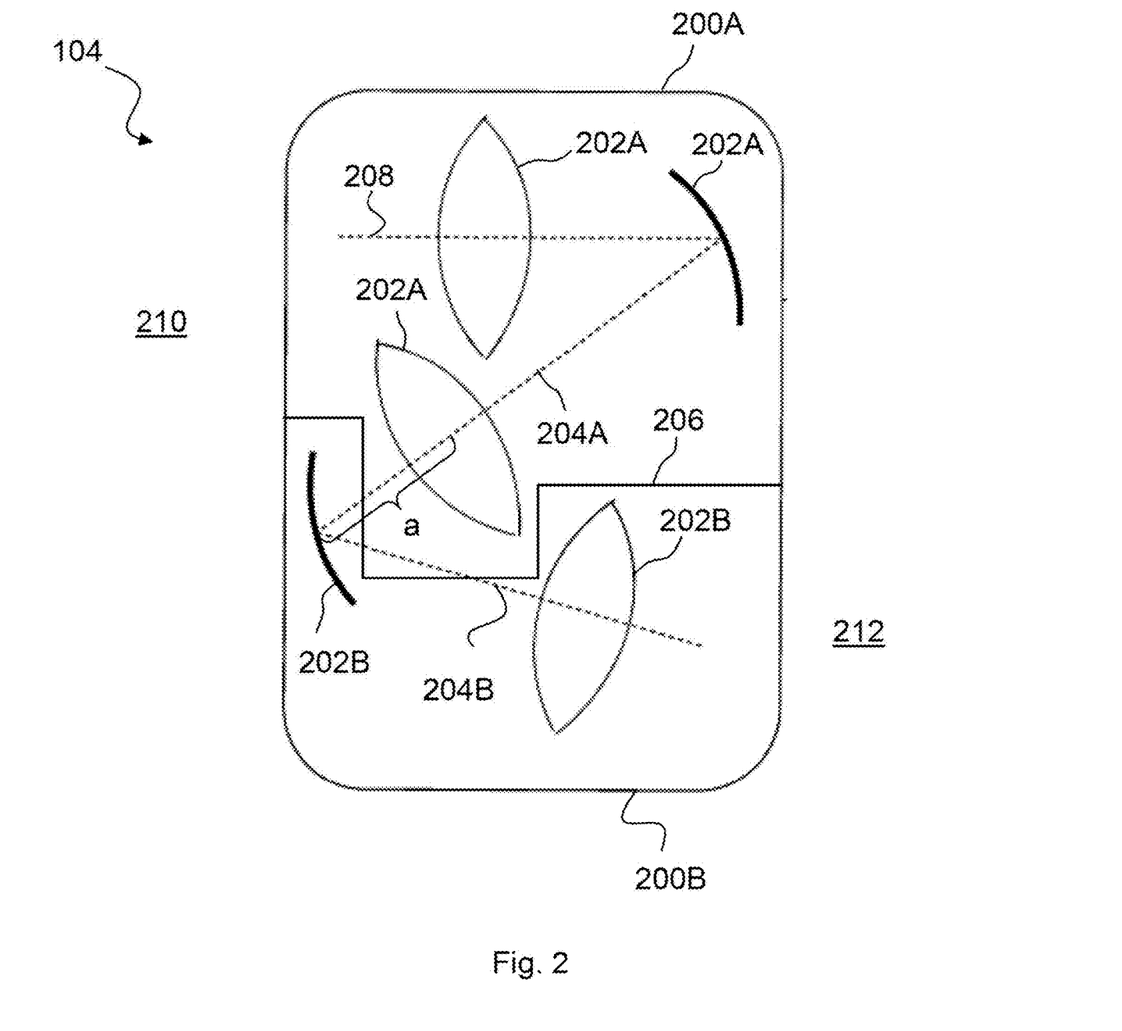
FIG. 2 schematically shows a projection lens of a lithography apparatus, including a first and a second partial lens.

A method for producing, in particular, the projection lens 104 in a lithography apparatus 100 according to FIG. 1A or 1B is explained in more detail below, with reference initially being made to FIGS. 2 and 8. Here, the projection lens 104 is also referred to synonymously as projection system 104.

By way of example, the projection lens 104 is composed of two partial lenses 200A, 200B. However, the projection lens 104 equally could be composed of three, four, five or more partial lenses. The representation of the optical elements 200A, 200B in the projection lens 104 of FIGS. 2ff. has been made very schematic in relation to the representation of FIGS. 1A and 1B.

A respective partial lens 200A, 200B includes a plurality of optical elements 202A, 202B, which may be embodied, for example, as mirrors and/or lens elements. A beam path within a respective partial lens 200A, 200B is denoted by 204A, 204B.

The two partial lenses 200A, 200B are detachably connectable to one another by way of an interface 206. FIG. 2 shows the joined state of the two partial lenses 200A, 200B, in which they form the assembled projection lens 104. A continuous beam path 208, which includes the partial beam paths 204A, 204B, arises in the process. The beam path 208 leads from an entry side 210 of the projection lens 104 to the exit side 212 of the projection lens 104 via the optical elements 202A, via the interface 206 and via the optical elements 202B. The entry side 210 of the projection lens 104 also forms the entry side of the partial lens 200A at the same time. The interface 206 forms both the exit side of the partial lens 200A and the entry side of the partial lens 200B. The exit side 212 of the projection lens 104 also forms the exit side of the partial lens 200B at the same time.

The entry side 210 and exit side 212 have a homocentric beam path, and so an image, in particular the structured mask 120 (see FIG. 1A), is imaged on the wafer 122.

However, the optical elements 202A and 202B, respectively, of a respective partial lens 200A, 200B should be adjusted separately in the present case, for example at the producer of the lithography apparatus 100. The partial lenses 200A, 200B qualified thus are subsequently transported to the customer and assembled there to form the projection lens 104.

Figure 3A:
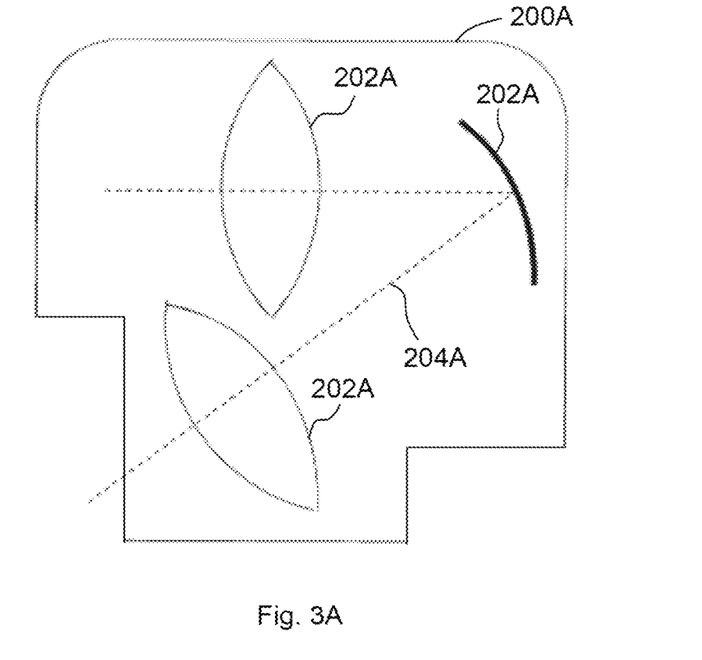
FIG. 3A shows the first partial lens from FIG. 2.
Figure 3B:
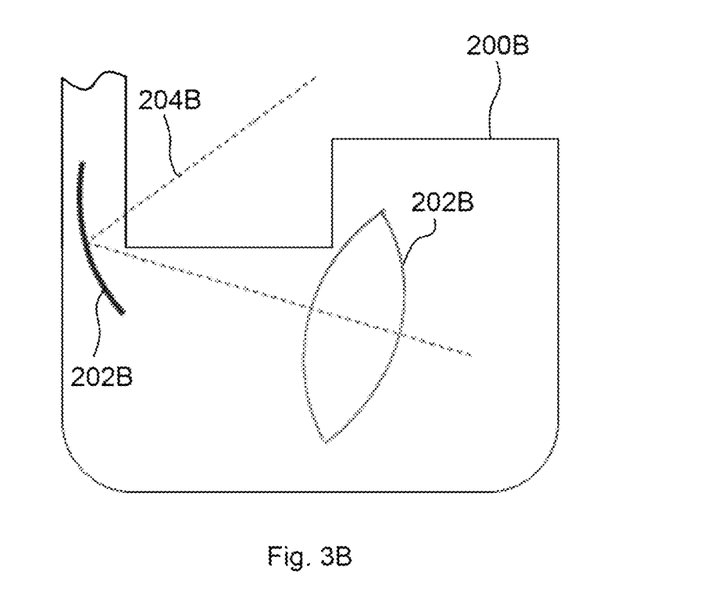
FIG. 3B shows the second partial lens from FIG. 2.

Therefore, the first and second partial lens 200A, 200B are provided in a first method step 801 (see FIG. 8), as illustrated in FIGS. 3A and 3B. On account of the chosen profile of the interface 206, the beam paths of these partial lenses 200A, 200B are not homocentric at the exit side of the partial lens 200A and at the entry side of the partial lens 200B.

The interface 206 preferably can be chosen in a part of the beam path 208 in which the distance between two adjacent optical elements 202A, 202B is greater than the direct distance between any other optical elements 202A, 202B in the projection lens 104. This longest distance is denoted by a in FIG. 2 (it does not correspond to the illustration of FIG. 2 since the latter, in particular, is not true to scale in this respect).

Figure 4:
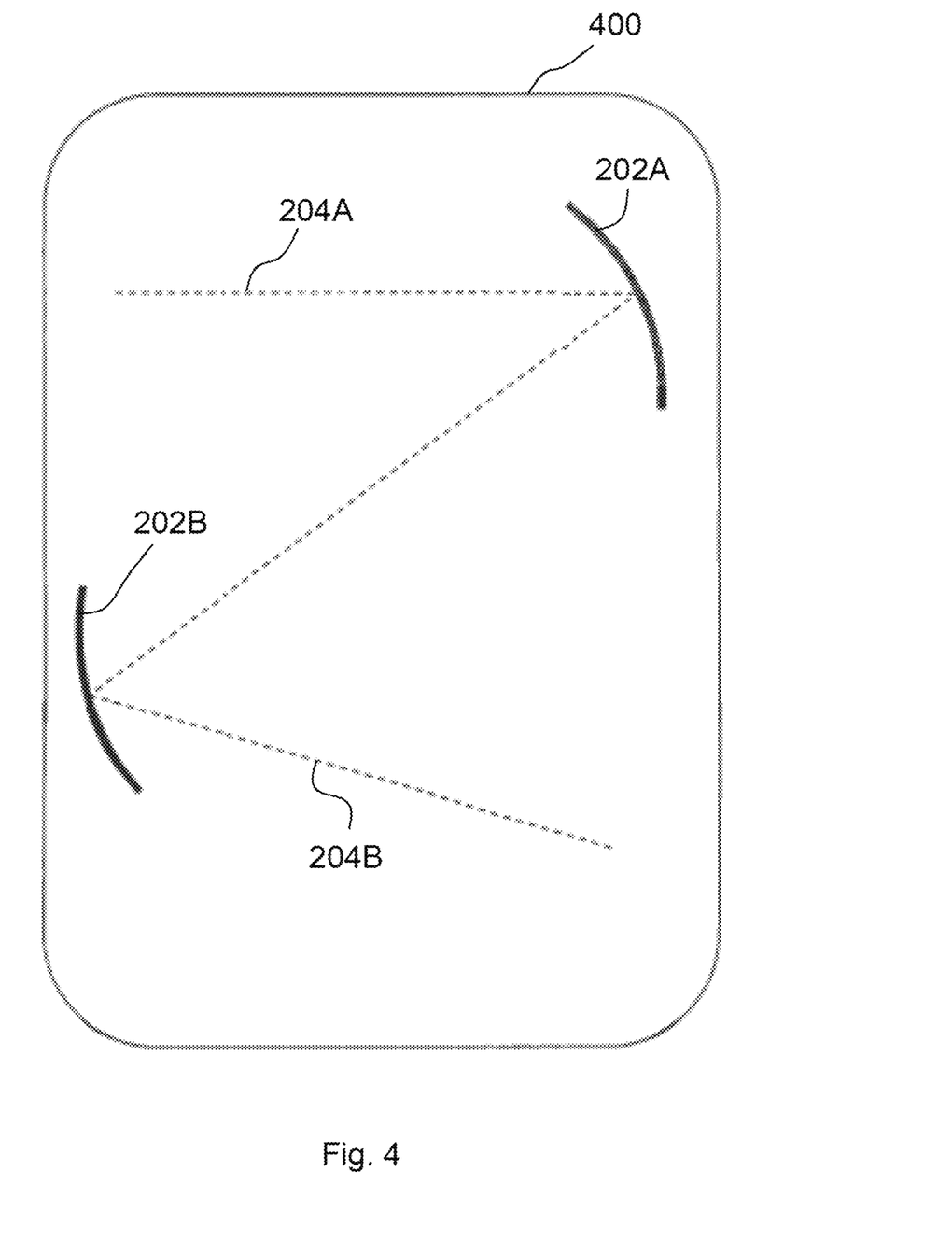
FIG. 4 shows an embodiment which likewise represents a partial lens within the present meaning.

FIG. 4 illustrates, in a purely complementary manner, a partial lens 400 which also represents a partial lens within the present meaning, even though it has emerged by changing the adjacency relationships of the optical elements. This is because, in comparison with the partial lenses according to FIGS. 3A and 3B, the lenses 202A were omitted in the case of FIG. 4. According to the definition, the adjacency relationships of the optical elements 202A, 202B are not modified when disassembling and assembling the partial lenses 200A, 200B.

Figure 8:
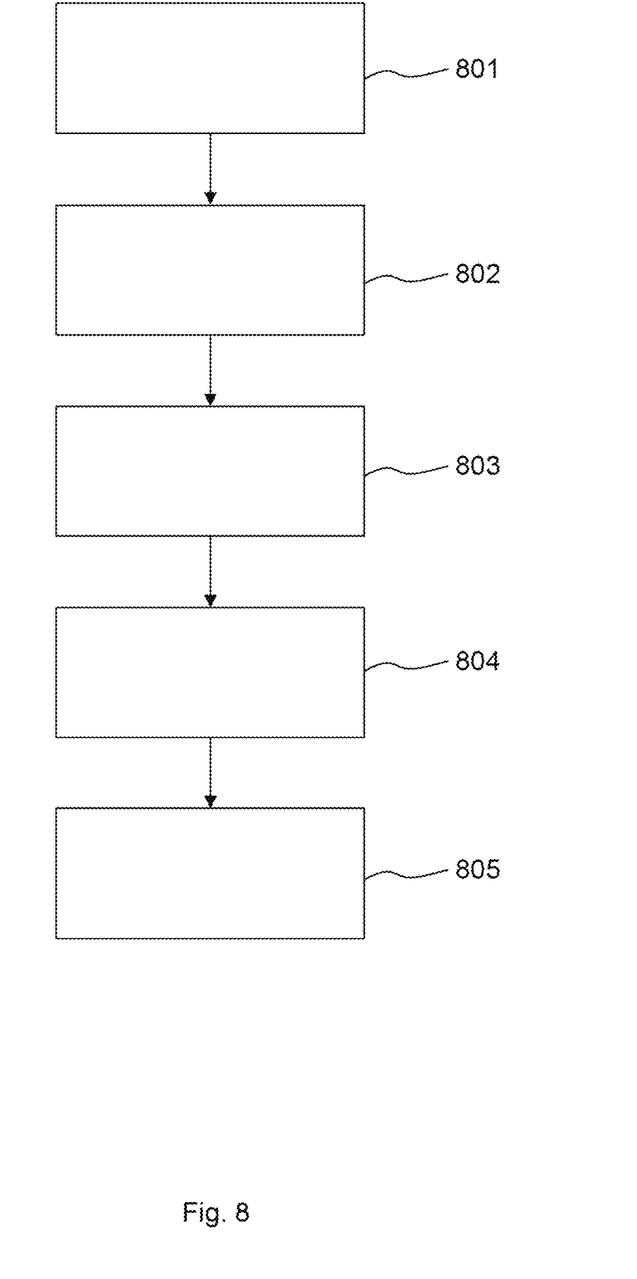
FIG. 8 shows a flowchart of a method according to an exemplary embodiment.

FIG. 8 now shows a method step 802. In method step 802, at least one first light beam, denoted by 500 in an exemplary manner in FIG. 5B, is transmitted along the beam path 204A of the first partial lens 200A and captured downstream of the partial lens 200A.

Subsequently, an optical characteristic of the partial lens 200A is ascertained on the basis of the captured, at least one first light beam 500 in a step 803.

The plurality of optical elements 202A of the first partial lens 200A are adjusted, i.e. positioned and/or aligned, in a step 804. Naturally, the adjustment can only also relate to one or more of the optical elements 202A of the first partial lens 200A. The adjustment is carried out depending on the ascertained optical characteristic. Following this, the optical elements 202A can be fixed at their respective positions.

The aforementioned steps are now repeated with respect to the second partial lens 200B. That is to say, the at least one light beam 500 is transmitted along the beam path 204B of the second partial lens 200B and captured downstream of the second partial lens 200B in step 802. Subsequently, an optical characteristic of the second partial lens 200B is ascertained on the basis of the captured, at least one first light beam 500 in step 803. In step 804, the optical elements 202B of the second partial lens 200B are adjusted depending on the ascertained optical characteristic and finally fixed.

In step 805, the first and second partial lens 200A, 200B are joined to produce the projection lens 104.

Naturally, steps 801 to 804 above can also be carried out in parallel. That is to say the optical qualification of the two partial lenses 200A, 200B is carried out simultaneously. Naturally, a different lens can also be produced instead of the projection lens 104.

Figure 5A:
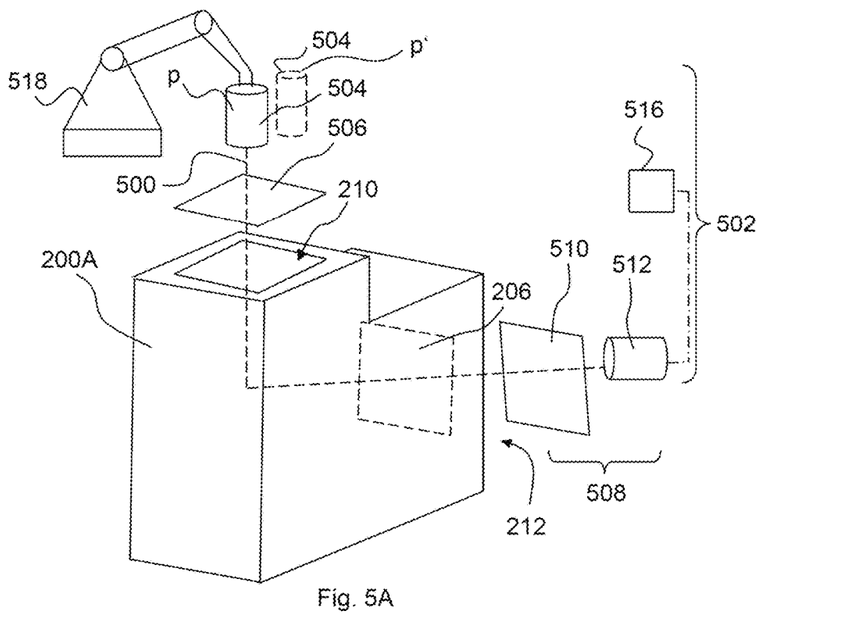
FIGS. 5A and 5B show a perspective view and a schematic view, respectively, of a deflectometric measuring method according to one embodiment.
Figure 5B:
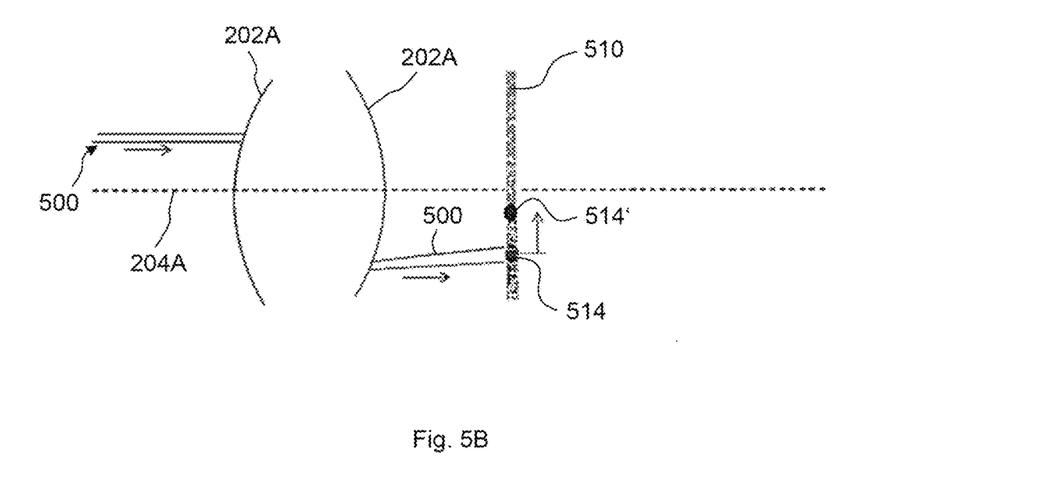
Figure 6A:
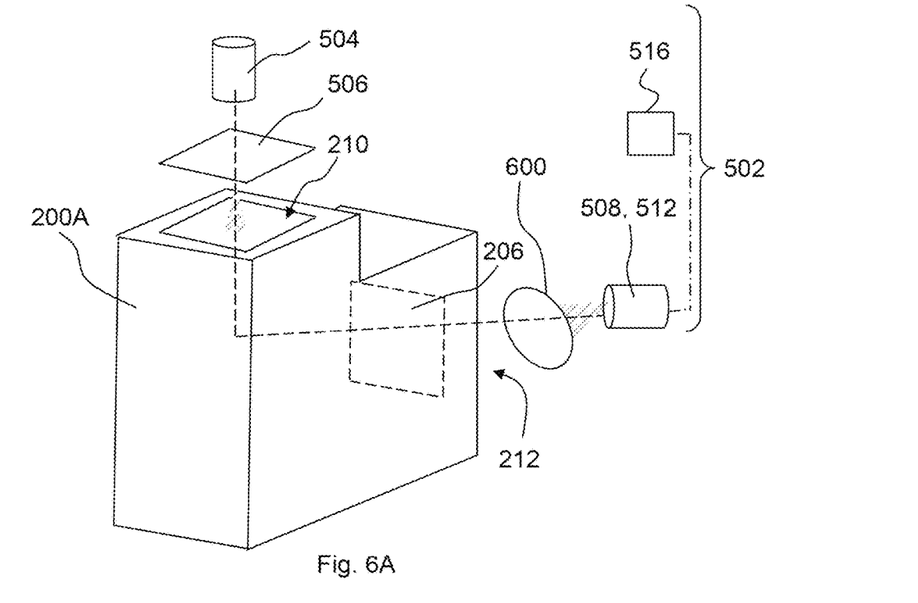
FIGS. 6A and 6B show a perspective view and a schematic view, respectively, of a method for a wavefront measurement according to one embodiment.
Figure 6B:
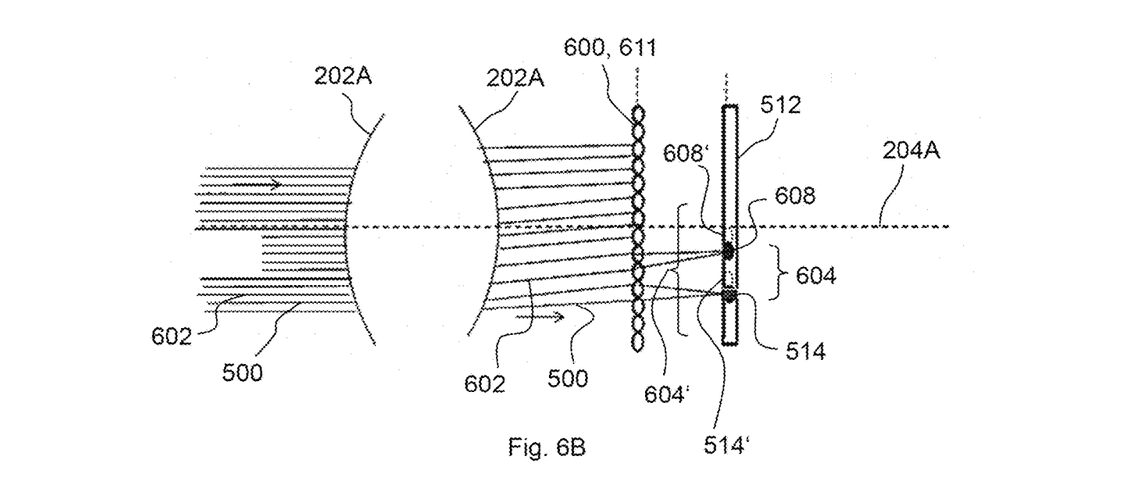
Figure 7A:
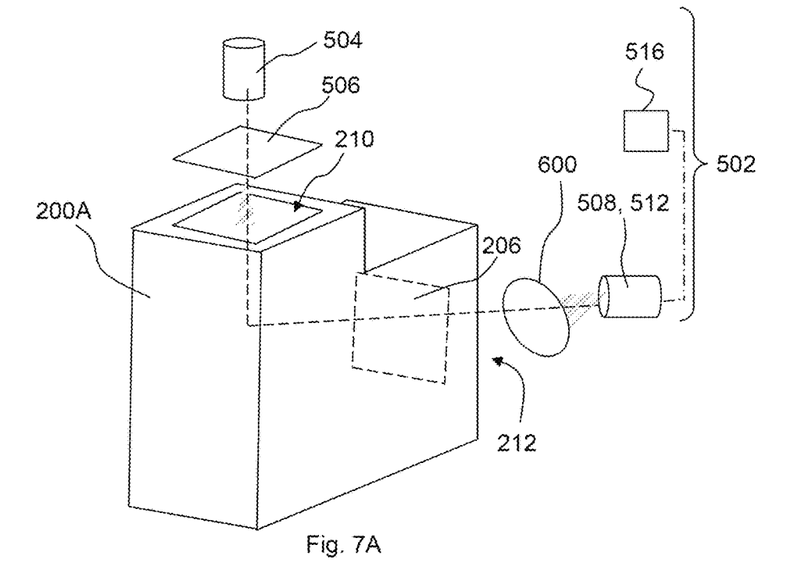
FIGS. 7A and 7B show a perspective view and a schematic view, respectively, of the method according to FIGS. 6A and 6B with an additionally provided computer-generated hologram.
Figure 7B:
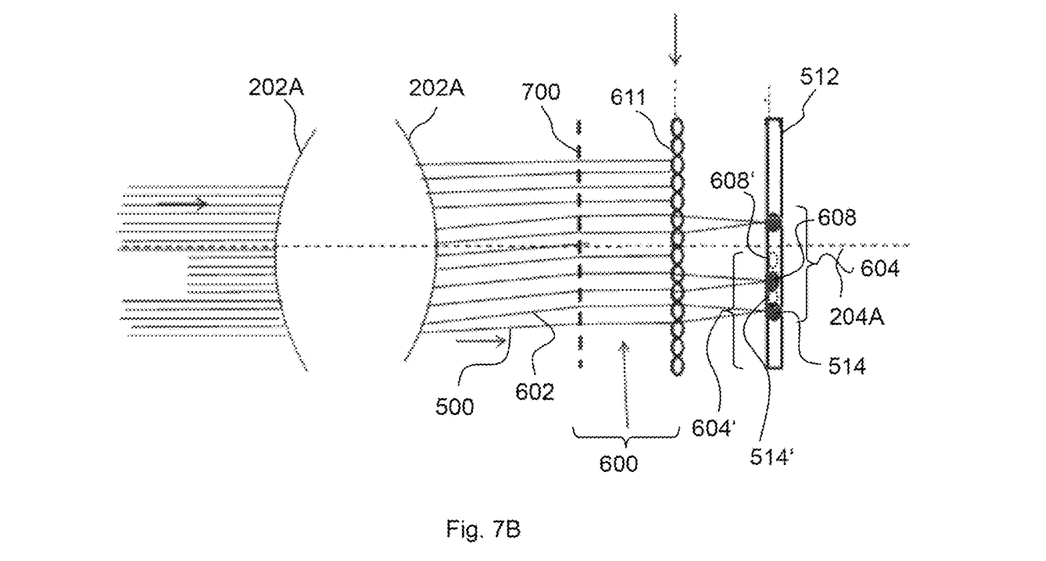

Below, steps 802 and 803 are illustrated in detail on the basis of three different methods, wherein FIGS. 5A and 5B illustrate a deflectometric measuring method, FIGS. 6A and 6B illustrate a method for a wavefront measurement and FIGS. 7A and 7B illustrate a method for a wavefront measurement with the aid of a computer-generated hologram.

FIG. 5A shows a perspective view of the first partial lens 200A in a perspective view. The first partial lens 200A is arranged in a measurement system 502 which carries out steps 802 and 803.

The measurement system 502 includes a light source 504, for example a laser, and a mask 506 upstream of the entry side 210 of the partial lens 200A. The light source 504 produces a light beam 500 (for example, a narrow light beam, in particular a laser beam).

The light beam 500 is incident on the mask 506, i.e. illuminates the latter. The mask 506 can be structured in such a way that it filters a defined portion out of the light beam, i.e., in particular, produces collimated or prepared test beams. In particular, the mask 506 can also be configured to produce a starry sky.

After passing through the mask 506, the light beam 500 traverses the partial lens 200A, passes the plurality of optical elements 202A (see also FIG. 5B) in the process and leaves the partial lens 200A again at its exit. Thereupon, the light beam 500 is incident on a capturing device 508. By way of example, the capturing device 508 includes a ground glass screen 510 and, downstream thereof, a camera 512 which itself may have a lens (not illustrated).

The first light beam 500 forms a light spot 514 on the ground glass screen 510. The camera 512, which e.g. has a CCD chip, records the light spot 514.

Furthermore, the measurement system 502 has an ascertaining device 516, which compares the light spot 514 to a reference light spot 514'. The reference light spot 514' simply may be a parameter such as e.g. an intended position, which is stored in a data medium of the ascertaining device 516. Then, the actual position of the light spot 514 is compared to the intended position of the reference light spot 514'. By way of example, the comparison result represents an optical characteristic within the present meaning. Depending on the comparison result of the optical characteristic, the ascertaining device 516 is able to produce exit information which specifies which optical elements 202A have to be adjusted in what manner. The subsequent adjustment can be effectuated in an automated manner.

Further, the measurement system 502 may include a robot 518 which is configured to position the light source 504 at at least two different positions P, P'. As a result, two spaced apart light beams are produced (the second light beam is not illustrated in FIG. 5B for reasons of clarity). The two light beams are produced sequentially, i.e. successively in time. The accuracy of the deflectometric measurement that is described in conjunction with FIGS. 5A and 5B can be improved via the second light beam or even further light beams, i.e. the positions and alignments of the optical elements 202A can be captured in a further improved manner.

The exemplary embodiment according to FIGS. 6A and 6B which illustrates a wavefront measurement differs from the exemplary embodiment according to FIGS. 6A and 6B by virtue of, in particular, a correcting optical unit 600, followed by the capturing device 508, 512, the latter e.g. in the form of a camera, being arranged downstream of the exit 206. According to the exemplary embodiment, the correcting optical unit 600, as may be seen in FIG. 6B, is embodied in the form of a microlens array 611. Further, FIG. 6B shows an electronic chip, for example a CMOS or CCD chip, of the camera 512.

The microlens array 611 images light beams 500, 602, which are respectively assigned to different wavefronts, on the camera 512 in the form of a light spot pattern 604 including a plurality of light points 514, 608. Together with the camera 512, the correcting optical unit 600 can form a Shack-Hartmann sensor.

According to an embodiment, the correcting optical unit 600 is configured in such a way that it reproduces the effect of the second partial lens 202B. As a result, this leads to an image at the entry side 212 of the first partial lens 200A being correctly imaged at the exit side 206, on the camera 512 in this case. This is particularly preferably achieved by virtue of, as illustrated in the FIGS. 7A and 7B, the correcting optical unit 600 furthermore including a computer-generated hologram 700. By way of example, the computer-generated hologram 700 can be configured to parallelize the light beams 500, 602. Then, the parallel light beams are incident on the microlens array 611 in parallel. If use is made of EUV light, a pinhole aperture grid (not illustrated) is preferred instead of the microlens array 611 (this applies accordingly to FIG. 6B).

In contrast to the exemplary embodiments according to FIGS. 6A and 6B, a regular—and not an irregular—light spot pattern 604 is produced on the camera 512 in the exemplary embodiment according to FIGS. 7A and 7B. A comparison with a corresponding referenced light spot pattern 604' then leads to the determination of the optical characteristic. By way of example a distance between the light spots 514, 608 of the light spot pattern 604 and reference light spots 514', 608' of a reference light spot pattern 604' may be ascertained in the ascertaining device 516 and increasingly minimized by an appropriate adjustment of the optical elements 202A—this applying both to the exemplary embodiment according to FIGS. 7A and 7B and to the exemplary embodiment according to FIGS. 6A and 6B.

By way of example, one of the measuring methods described in FIGS. 5A to 7B may also be carried out in different positions of one or more optical elements 202A. By way of example, a corresponding optical element 202A can be actuated via an actuator between two different positions of same.

The measuring methods described above may also be combined. By way of example, the partial lens 200A initially can be measured via the method according to FIGS. 6A and 6B, an approximate adjustment of the optical elements 202A may be subsequently undertaken, this may be followed by measuring the partial lens 200A via the method according to FIGS. 7A and 7B and a fine adjustment of the optical elements 202A may be undertaken at the end.

After the projection lens 104 is produced, the imaging properties of same are checked. Subsequently, there then may be a surface treatment of individual optical elements 202A, 202B or a readjustment of same by way of appropriate actuators or manipulators.

Although the disclosure has been described on the basis of various exemplary embodiments, it is not in any way restricted to them but rather can be modified in a wide variety of ways.

LIST OF REFERENCE SIGNS

100 Lithography installation
100A EUV lithography apparatus

100B DUV lithography apparatus
102 Beam-shaping and illumination system
104 Projection system
106A EUV light source
106B DUV light source
108A EUV radiation
108B DUV radiation
110 Mirror
112 Mirror
114 Mirror
116 Mirror
118 Mirror
120 Reticle
122 Wafer
124 Optical axis of the projection system
126 Control device
128 Stage of the reticle
130 Stage of the wafer
132 Lens element
134 Mirror
136 Mirror
200A Partial lens
200B Partial lens
202A Optical element
202B Optical element
204A Beam path
204B Beam path
206 Interface
208 Beam path
210 Entry side
212 Exit side
400 Partial lens
500 Light beam
502 Measurement system
504 Light source
506 Mask
508 Capture device
510 Ground glass screen
512 Camera
514 Light spot
514' Reference light spot
516 Ascertaining device
518 Robot
600 Correcting optical unit
602 Light beam
604 Light spot pattern
604' Reference light spot pattern
608 Light spot
608' Reference light spot
611 Microlens array
700 Computer-generated hologram
801-805 Method steps
a Longest distance

What is claimed is:

1. A method, comprising:
a) providing first and second partial lenses, the first partial lens comprising a plurality of optical elements, the second partial lens comprising an optical element, each of the first and second partial lenses having a beam path comprising a non-homocentric embodiment on its entry side or its exit side;
b) transmitting a first light beam along a respective beam path of the first and second partial lenses and capturing the first light beam downstream of the respective partial lens;
c) ascertaining an optical characteristic of a respective partial lens based on the captured first light beam;
d) adjusting the plurality of optical elements of the first partial lens and the optical element of the second partial lens depending on the ascertained optical characteristic, and
e) joining the first and second partial lenses to produce a lens.

2. The method of claim 1, further comprising capture the first light beam by a capturing device on which the light beam produces a light spot, wherein ascertaining the at least one optical characteristic comprises comparing the light spot to a reference light spot.

3. The method of claim 2, wherein a position of the light spot is compared to a position of the reference light spot.

4. The method of claim 1, wherein at least one first and one spaced apart second light beams are transmitted along the respective beam path of the first and second partial lenses and captured downstream of the respective partial lens, and wherein the at least one optical characteristic is ascertained on the basis of the captured first and second light beams.

5. The method of claim 4, wherein the first and second light beams are captured by a capturing device on which the first and second light beams produce a light spot pattern, and ascertaining the optical characteristic comprises comparing the light spot pattern to a reference light spot pattern.

6. The method of claim 4, wherein the first and the spaced apart second light beam are produced by virtue of a light source being moved between two positions.

7. The method of claim 6, wherein the light source is moved between the two positions via a robot.

8. The method of claim 1, wherein the first and the spaced apart second light beam are produced by virtue of two spaced apart light sources being provided at the same time.

9. The method of claim 1, wherein the optical characteristic of at least one partial lens is ascertained using a deflectometric measuring method.

10. The method of claim 9, wherein, for the deflectometric measuring method, at least one light source for producing the at least one first light beam and a mask illuminated thereby are arranged upstream of the at least one partial lens and a capturing device for capturing the at least one first light beam is arranged downstream of the corresponding partial lens.

11. The method of claim 1, wherein the optical characteristic of at least one partial lens is ascertained using a method for a wavefront measurement.

12. The method of claim 11, wherein, for the method for a wavefront measurement, at least one light source for producing the at least one first light beam and a mask illuminated thereby are arranged up-stream of the at least one partial lens, provision further being made of a correcting optical unit for correcting the at least one first light beam, and a capturing device for capturing the at least one first, corrected light beam is arranged downstream of the corresponding partial lens.

13. The method of claim 12, wherein the correcting optical unit comprises a microlens array or a pinhole aperture grid.

14. The method of claim 12, wherein the correcting optical unit comprises a computer-generated hologram.

15. The method of claim 12, wherein the correcting optical unit comprises respectively one computer-generated hologram for each light beam.

16. The method of claim 14, wherein the computer-generated hologram is arranged upstream of the microlens array or the pinhole aperture grid.

17. The method of claim 14, wherein the computer-generated hologram is configured to parallelize the first and second light beams.

18. The method of claim 14, wherein the at least one optical characteristic of at least one partial lens is ascertained using the wavefront measuring method without a computer-generated hologram in a first step and with a computer-generated hologram in a second step.

19. The method of claim 2, wherein the capturing device comprises a ground glass screen or an electronic chip.

20. The method of claim 1, wherein the plurality of optical elements of the first partial lens and the optical element of the second partial lens are fixed after d).

21. The method of claim 1, wherein each of the plurality of optical elements of the first partial lens or the optical element of the second partial lens is actuatable between first and second positions or alignment during the operation of the lithography apparatus, wherein c) is carried out in the first and second positions or alignments.

22. The method of claim 1, wherein an imaging optical characteristic of the produced lens is ascertained after e) at the operating wavelength.

23. The method of claim 22, wherein post-processing of surfaces or an actuation of one or more of the optical elements of the first or second partial lenses is effectuated depending on the ascertained imaging optical characteristic.

24. The method of claim 1, wherein an interface in the beam path between the first and second partial lenses subdivides a distance between an optical element of the first partial lens and an optical element of the second partial lens, the distance being longer than the longest distance between every two adjacent optical elements of the first and second partial lenses.

25. The method of claim 1, wherein at least three partial lenses are provided.

26. The method as of claim 1, wherein the plurality of optical elements of the first partial lens and/or the optical element of the second partial lens are mirrors and/or lens elements.

27. The method of claim 1, wherein first and second partial lenses are combined to form a partial lens.

28. The method of claim 27, wherein a) to e) are repeated with the combined partial lens.

* * * * *

UNITED STATES PATENT AND TRADEMARK OFFICE
CERTIFICATE OF CORRECTION

PATENT NO. : 10,345,547 B2
APPLICATION NO. : 15/813660
DATED : July 9, 2019
INVENTOR(S) : Steffen Fritzsche, Juergen Baier and Rolf Freimann Page 1 of 1

It is certified that error appears in the above-identified patent and that said Letters Patent is hereby corrected as shown below:

In the Claims

In Column 14, Lines 55-56, In Claim 12, delete "corre-sponding" and insert -- corresponding --, therefor.

Signed and Sealed this
Twenty-fourth Day of September, 2019

Andrei Iancu
*Director of the United States Patent and Trademark Office*